(12) United States Patent
Wang et al.

(10) Patent No.: US 8,877,358 B1
(45) Date of Patent: Nov. 4, 2014

(54) METHOD AND SYSTEM FOR PROVIDING A LASER CAVITY FOR AN ENERGY ASSISTED MAGNETIC RECORDING HEAD

(71) Applicant: Western Digital (Fremont), LLC, Fremont, CA (US)

(72) Inventors: Lei Wang, Danville, CA (US); Pezhman Monadgemi, Mountain View, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 13/941,474

(22) Filed: Jul. 13, 2013

Related U.S. Application Data

(62) Division of application No. 12/946,655, filed on Nov. 15, 2010, now Pat. No. 8,518,279.

(51) Int. Cl.
*H01L 43/12* (2006.01)

(52) U.S. Cl.
CPC ........................................ *H01L 43/12* (2013.01)
USPC .................. 428/816; 369/13.24; G9B/13.003

(58) Field of Classification Search
None
See application file for complete search history.

(56) References Cited

U.S. PATENT DOCUMENTS

| | | | |
|---|---|---|---|
| 3,765,969 A | 10/1973 | Kragness et al. | |
| 6,181,673 B1 * | 1/2001 | Wilde et al. | 369/300 |
| 6,275,453 B1 | 8/2001 | Ueyanagi et al. | |
| 7,098,976 B2 | 8/2006 | Minoura et al. | |
| 7,203,387 B2 | 4/2007 | Doan | |
| 7,349,614 B2 * | 3/2008 | Doan | 385/131 |
| 8,012,804 B1 * | 9/2011 | Wang et al. | 438/110 |
| 8,024,748 B1 * | 9/2011 | Moravec et al. | 720/659 |
| 8,107,326 B1 * | 1/2012 | Hirano et al. | 369/13.33 |
| 8,125,856 B1 * | 2/2012 | Li et al. | 369/13.01 |
| 8,134,794 B1 * | 3/2012 | Wang | 360/59 |
| 8,441,896 B2 * | 5/2013 | Wang et al. | 369/13.33 |
| 8,451,556 B1 * | 5/2013 | Wang et al. | 360/59 |
| 8,518,279 B1 | 8/2013 | Wang et al. | |
| 8,518,748 B1 * | 8/2013 | Wang et al. | 438/119 |
| 8,607,439 B1 * | 12/2013 | Wang et al. | 29/603.16 |
| 2005/0122849 A1 | 6/2005 | Ueyanagi | |
| 2005/0190682 A1 | 9/2005 | Gage et al. | |
| 2007/0165494 A1 | 7/2007 | Cho et al. | |
| 2008/0181560 A1 | 7/2008 | Suh et al. | |
| 2010/0302672 A1 | 12/2010 | Aoki et al. | |

(Continued)

OTHER PUBLICATIONS

M.N. Kryder et. al. "Heat Assisted Magnetic Recording", Proceedings of the IEEE, vol. 96, 2008, pp. 1810-1835.

(Continued)

*Primary Examiner* — Kevin Bernatz

(57) ABSTRACT

A method for providing a capping layer configured for an energy assisted magnetic recording (EAMR) head including at least one slider. The method comprises etching a substrate having a top surface using an etch to form a trench in the substrate, the trench having a first surface at a first angle from the top surface and a second surface having a second angle from the top surface. The method further comprises providing a protective coating exposing the second surface and covering the first surface, removing a portion of the substrate including the second surface to form a laser cavity within the substrate configured to fit a laser therein, and providing a reflective layer on the first surface to form a mirror, the cavity and mirror being configured for alignment of the laser to the laser cavity and to the mirror and for bonding the laser to the laser cavity.

2 Claims, 10 Drawing Sheets

(56) References Cited

U.S. PATENT DOCUMENTS

2011/0013497 A1* 1/2011 Sasaki et al. ............... 369/13.24
2011/0058273 A1* 3/2011 Sasaki et al. .................... 360/59
2011/0228416 A1* 9/2011 Sasaki et al. .................... 360/59

OTHER PUBLICATIONS

Office Action dated Nov. 15, 2012 from U.S. Appl. No. 12/946,655, 9 pages.

Notice of Allowance dated Apr. 29, 2013 from U.S. Appl. No. 12/946,655, 9 pages.

Strandman, et al., "Fabrication of 45 degree Mirrors Together with Well-Defined V-Grooves Using Wet Anistropic Etching of Silicon", Journal of Microelectromechanical Systems, vol. 4., No. 4, Dec. 1995, pp. 213-219.

* cited by examiner

METHOD AND SYSTEM FOR PROVIDING A LASER CAVITY FOR AN ENERGY ASSISTED MAGNETIC RECORDING HEAD

CROSS REFERENCE TO RELATED APPLICATIONS

This application is a divisional of U.S. patent application Ser. No. 12/946,655, filed on Nov. 15, 2010 which is hereby incorporated by reference in its entirety.

BACKGROUND

FIG. 1 depicts a side view of portion of a conventional energy assisted magnetic recording (EAMR) disk drive 10. The conventional EAMR disk drive 10 includes a recording media 12, a conventional slider 20, and a conventional laser diode 30 that are typically attached to a suspension (not shown). The conventional slider 20 has a leading edge 22, a trailing edge 26, and a back side 24. Although termed "edges", the leading edge 22 and trailing edge 26 are surfaces of the slider 20. The leading edge 22 and trailing edge 26 are so termed because of the direction the conventional media 12 travels with respect to the EAMR transducer 28. Other components that may be part of the conventional EAMR disk drive 10 are not shown. The conventional slider 20 is typically attached to the suspension at its back side 24. A conventional EAMR transducer 22 is coupled with the slider 20.

The laser diode 30 is coupled in proximity to the EAMR transducer 28 on the trailing edge 26 of the slider 20. Light from the conventional laser diode 30 is provided substantially along the optic axis 32 of the conventional laser diode 30 to the trailing edge 26 of the slider 20. More specifically, light from the laser diode 30 is provided to a grating (not shown) of conventional EAMR transducer 28. The light from the laser diode 30 coupled into the grating is then provided to a waveguide (not shown). The waveguide directs the light toward the conventional media 12, heating a small region of the conventional media 12. The conventional EAMR transducer 28 magnetically writes to the conventional media 12 in the region the conventional media 12 is heated.

FIG. 2 depicts a conventional method 50 for fabricating a portion of the conventional EAMR disk drive 10. For simplicity, only a portion of the method 50 is described. The EA conventional MR transducer 28 is fabricated on the front side of a conventional substrate, such as an AlTiC substrate, via step 52. Typically, a reader for the conventional disk drive 10 has already been fabricated. Thus, the conventional EAMR transducer 28 is built on other structures. Typically, multiple transducers are fabricated in parallel on the same substrate.

Once fabrication of the conventional EAMR transducer 28 is completed, the laser diode 30 may be mounted in proximity to the conventional EAMR transducer 28, via step 54. More specifically, the laser diode 30 is mounted in proximity to the trailing surface 26 of the slider 20. The EAMR heads may then be separated, via step 56. For example, the substrate holding the EAMR transducers 28 may be cleaved or otherwise cut into individual sliders 20. The front side of the substrate, on which the EAMR transducer 28 is fabricated, becomes the trailing edge 26 of the slider 20. In other embodiments, the EAMR heads are separated prior to the laser diode 30 being mounted. However, in both cases, the laser diode is mounted in proximity to the EAMR transducer 26 and, therefore, in proximity to the trailing edge 26. The fabrication of the conventional drive 10 may then be completed. For example, the conventional EAMR head including the conventional slider 20 and conventional EAMR transducer 28 may be mounted on a flexure and then in a disk drive.

Although the conventional EAMR disk drive 10 and method 50 may function, improvements are desired. More specifically, coupling the laser 30 to the trailing edge 26 of the slider 20 is problematic. The laser 30 would occupy a larger portion of the trailing edge 26. This space is normally reserved for items such as contacts to the transducer 28. Although smaller lasers 30 might be used, such lasers are typically less reliable. Consequently, reducing the size of the laser 30 may adversely affect reliability of the conventional EAMR disk drive 10.

Accordingly, what is needed are improved methods and systems for fabricating EAMR disk drives, including coupling the laser with the EAMR transducer and assembling the slider, the laser, and the flexure (not shown) are desired.

BRIEF SUMMARY OF THE INVENTION

A method and system for providing a capping layer configured for an energy assisted magnetic recording (EAMR) head is described. The EAMR head includes at least one slider. The method includes etching a substrate having a top surface. A trench is thus formed in the substrate. The trench has a first surface at a first angle from the top surface and a second surface having a second angle from the top surface. The first angle is a desired angle for alignment to the EAMR head. The method also includes providing a protective coating that exposes the second surface and covers the first surface. A portion of the substrate including the second surface is removed to form a laser cavity within the substrate. The laser cavity is configured to fit a laser therein. The method and system also include providing a reflective layer on the first surface to form a mirror. The cavity and the mirror are configured for alignment of the laser to the laser cavity, for alignment of the laser to the mirror, and for bonding the laser to the laser cavity.

DETAILED DESCRIPTION OF EMBODIMENTS OF THE INVENTION

Figure 1:
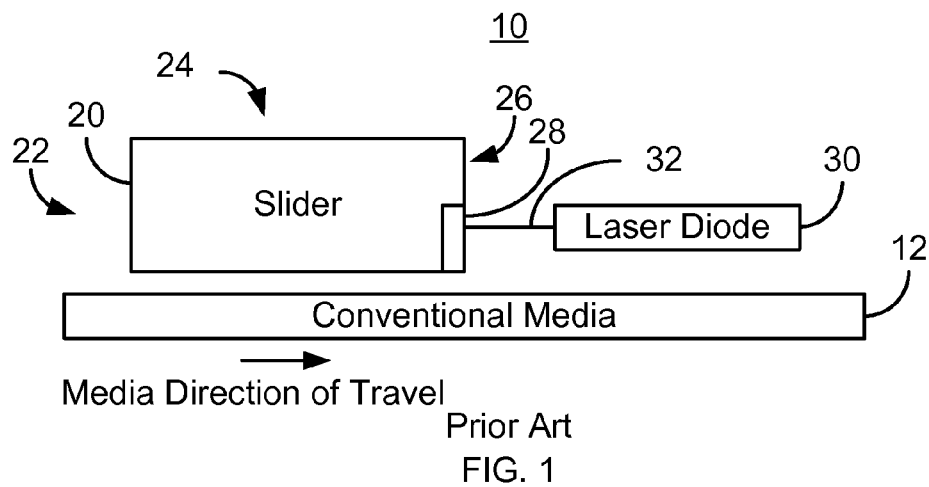
FIG. 1 is a diagram depicting a portion of a conventional energy assisted magnetic recording disk drive.
Figure 2:
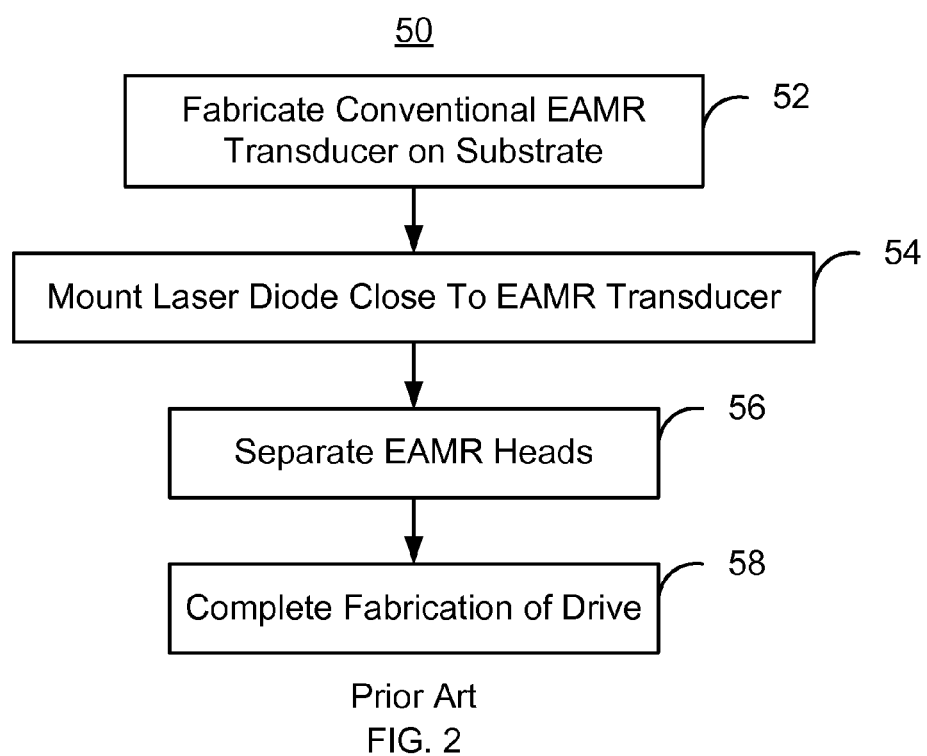
FIG. 2 is a flow chart depicting a conventional method for fabricating a conventional EAMR disk drive.
Figure 3:
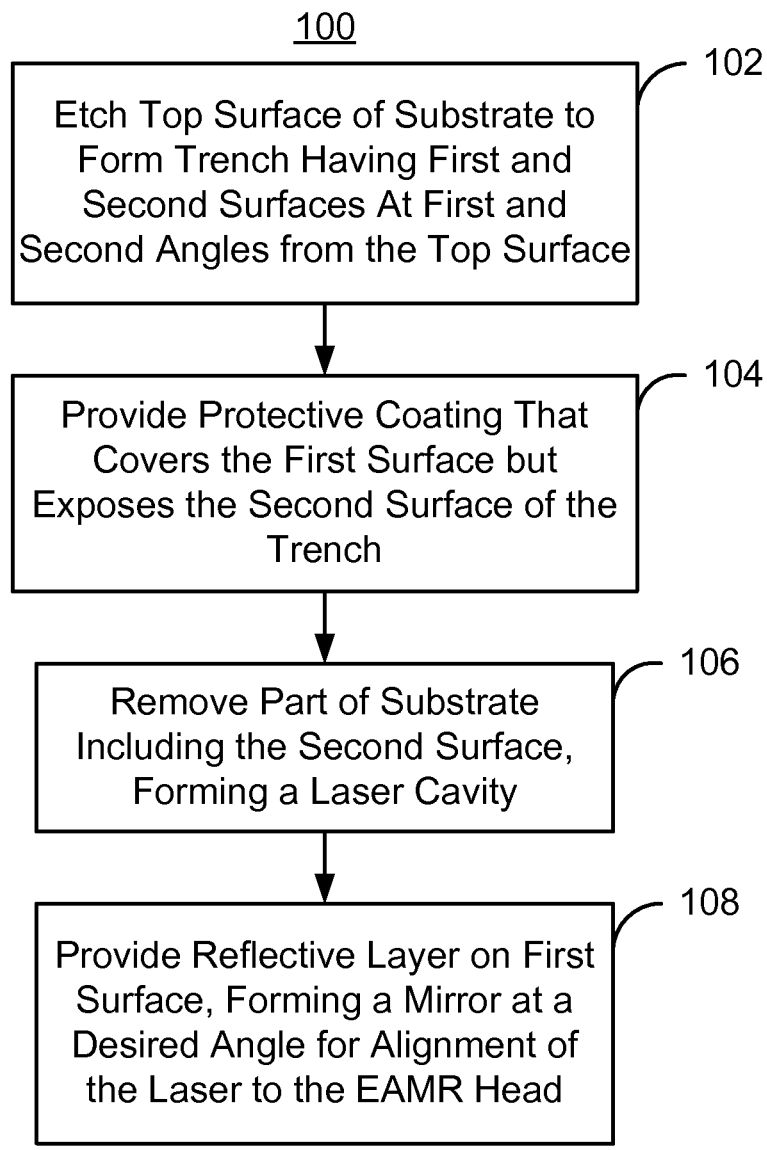
FIG. 3 is a flow chart depicting an exemplary embodiment of a method for fabricating a capping layer for an EAMR head.

FIG. 3 is a flow chart depicting an exemplary embodiment of a method 100 for fabricating capping layers that may be used in conjunction with EAMR heads. Although certain steps are shown, some steps may be omitted, interleaved, performed in another order, and/or combined. The EAMR heads may be merged heads, each of which includes an EAMR write transducer, a read transducer (not shown) and resides on a slider. Further, the capping layers being fabricated may be used in other applications in which alignment of lasers is desired.

A substrate having a top surface is etched, via step 102. The etch forms a trench in the substrate. The trench has a first surface at a first angle from the top surface and a second surface having a second angle from the top surface. In some embodiments, the trench formed has the shape of a "v". However, in other embodiments, the trench may have another shape. The first angle is a desired angle for alignment to the EAMR head. In some embodiments, the substrate may be Si. In addition, the substrate may be processed to have the desired top surface. For example, a Si substrate may be cut so that the top surface is at a desired angle from a particular crystallographic plane. For example, the Si substrate may be cut such that the top surface is 9.7° from the [100] crystallographic plane. The etch used in step 102 is anisotropic. In some embodiments, the etch may have different etch rates for different crystallographic planes. For example, the etch may be a wet etch that etches the [111] plane set at a lower rate than other plane sets. Such an etch may be anisotropic and self limiting. For example, the etch may result in a v-shaped trench with a first surface that is a [−1 −1 −1] plane of the [111] plane set and wherein the second surface is a [111] plane of the [111] plane set. Because the etch removes the Si in the [111] plane family at a lower rate, the etch is self limiting because the etch slows or stops at the [−1 −1 −1] and [111] planes. Note that although the angles are described as being at a particular value, these are within tolerance. Thus, the first surface may be forty-five degrees from the top surface, while the second surface may be 64.4° from the top surface. For example, in some embodiments, the first surface is within one degree of forty-five degrees.

After the trench is etched, a protective coating is provided, via step 104. The protective coating exposes the second surface and covers the first surface. Step 104 may be performed by depositing a coating layer, and then removing the coating on the second surface of the trench. Step 104 may be achieved by ion milling the substrate at a milling angle. The milling angle is within a particular angle of the first surface. In some embodiments, the particular angle is twenty degrees. In other embodiments, the particular angle is ten degrees.

A laser cavity is provided, via step 106. In some embodiments, a portion of the substrate including the second surface is removed to form the laser cavity within the substrate. The laser cavity is configured to fit a laser therein. In some embodiments, a deep Si reactive ion etch (RIE) is used. The removal process of step 106 may also shape the laser cavity to improve alignment. For example, the laser cavity may be formed such that a standoff edge is formed. A standoff edge may be formed when the cavity has a re-entrant sidewall. A re-entrant sidewall occurs when the walls are angled away from each other. Thus, laser cavity may be wider at the bottom than at the standoff edge. The re-entrant sidewall may make a re-entrant angle of not more than ten degrees from normal to the bottom of the cavity. In some such embodiments, the re-entrant angle may be at least one degree. In other embodiments, the re-entrant angle is at least five degrees. In still other embodiments, the re-entrant angle may be greater than ten degrees. For example, the re-entrant angle might be up to thirty degrees. Further, the standoff edge may be formed at the edge of the first surface.

At least one reflective layer is provided on the first surface to form a mirror, via step 108. Thus, a mirror that configured to be aligned with the laser in the laser cavity may be provided. The laser cavity is configured to be aligned with and hold the laser and to bond the substrate to the laser. In some embodiments, the reflective layer is provided after the formation of the laser cavity in step 106. In other embodiments, the reflective layer may be deposited before the protective layer is provided in step 104. In such an embodiment, the portion of the reflective layer on the second surface may be removed in step 104 and/or 106. In either case, the reflective layer is desired to be sufficiently smooth to reflect light from the laser. For example, in some embodiments, the reflective layer and the underlying first surface are sufficiently smooth that the root mean square (RMS) variation in roughness is not more than five nanometers.

Figure 4:
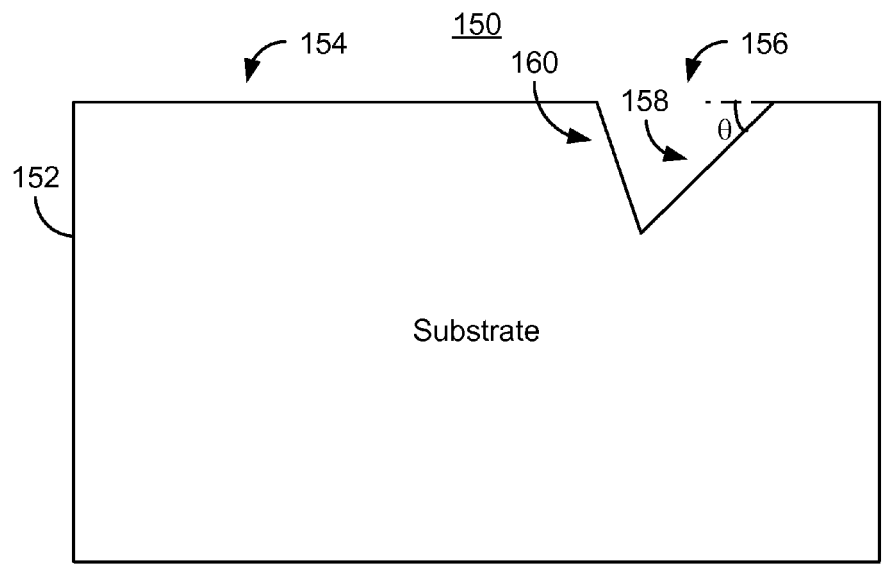
FIG. 4 is a diagram depicting an exemplary embodiment of a capping layer during fabrication.
Figure 5:
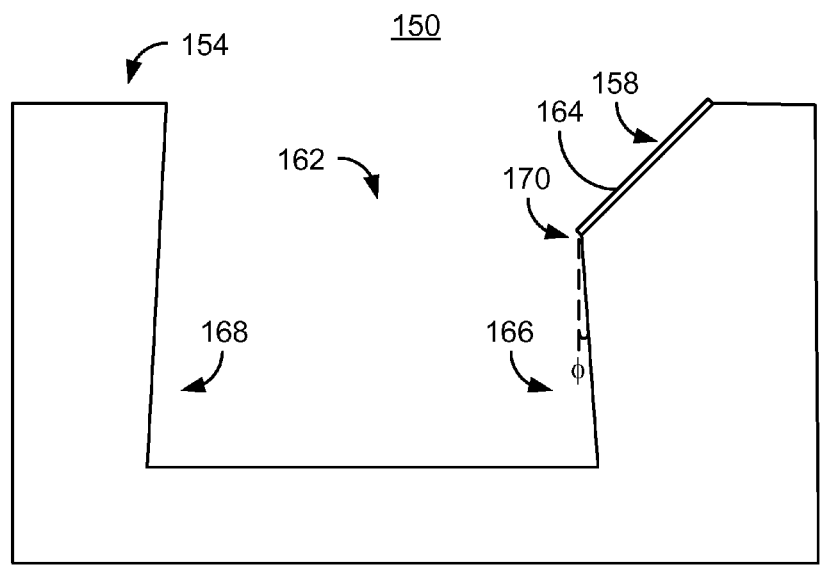
FIG. 5 is a diagram depicting an exemplary embodiment of the capping layer.

FIGS. 4-5 are diagrams depicting an exemplary embodiment of a capping layer 150 fabricated using the method 100. For clarity, FIGS. 4-5 are not to scale. The substrate 152 for the capping layer 150 has a top surface 154. FIG. 4 depicts the capping layer 150 after step 102 has been performed. Thus, a trench 156 has been formed in the substrate 152. The trench 154 has a v-groove shape. However, in another embodiment, the trench 156 may have a different shape. The trench 156 includes a first surface 158 and a second surface 160. The first surface 158 is at an angle, θ, from the top surface 154. In some embodiments, θ is forty-five degrees. FIG. 5 depicts the capping layer 150 after completion. Thus, the laser cavity 162 has been formed. In addition, the reflective layer(s) 164 have been provided on the first surface 158, forming a mirror 164. Further, the sidewalls 166 and 168 of the laser cavity 162 are re-entrant. Thus, the standoff edge 170 juts into the laser cavity 162.

Using the method 100, the capping layer 150 may be fabricated. The mirror 164 may be aligned as desired to a laser (not shown). The top surface 154 of the capping layer 150 is flat. In addition, the first surface 158 is at a known and well controlled angle, θ, from the top surface 154. In some embodiments, the angle θ is controlled to within one degree of a particular crystallographic plane. Thus, the mirror 164 may be aligned to provide light from the laser to the desired location. The mirror 164 has the desired smoothness to be capable of reflecting light. As discussed above, in some embodiments, the mirror 164 has an RMS variation in smoothness of less than or equal to five nanometers. Thus, the smoothness and orientation of the mirror 164 are well controlled. Consequently, the mirror 164 may be aligned as desired. In addition, the laser cavity 162 may have re-entrant sidewalls 166 and 168. In particular, the sidewall 166 may have a re-entrant angle ϕ. Thus, the laser (not shown) that fits within the laser cavity 162 may be aligned to the standoff edge 170 as well as to the top surface 156. Thus, the alignment and location of the laser in the capping layer 150 may be achieved. Performance of an EAMR head using the laser may also be enhanced.

Figure 6:
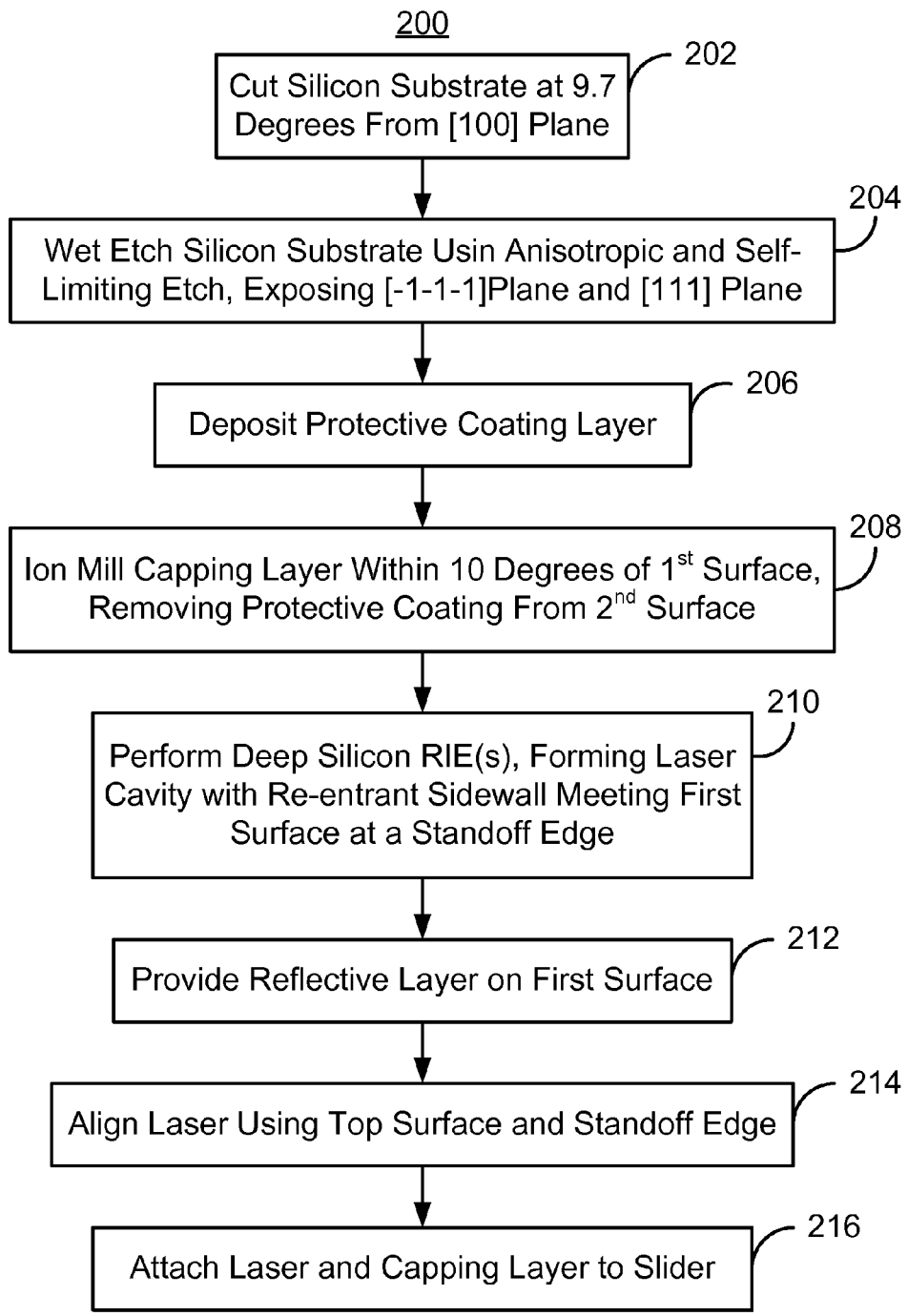
FIG. 6 is a flow chart depicting another exemplary embodiment of a method for fabricating an EAMR head.

FIG. 6 is a flow chart depicting another exemplary embodiment of a method 200 for fabricating an EAMR head. FIGS. 7-14 are diagrams depicting portions of an EAMR head 250 during fabrication. For clarity, FIGS. 7-14 are not to scale. Further, for simplicity, not all components are labeled in FIGS. 7-14. Referring to FIGS. 6-14, the EAMR head 250 being fabricated may be part of a merged head that also includes a read head (not shown in FIGS. 7-14) and resides on a slider of a disk drive. Although the method 200 is described in the context of a single EAMR head and capping layer depicted in FIGS. 7-14, multiple heads are typically fabricated in parallel.

Figure 7:
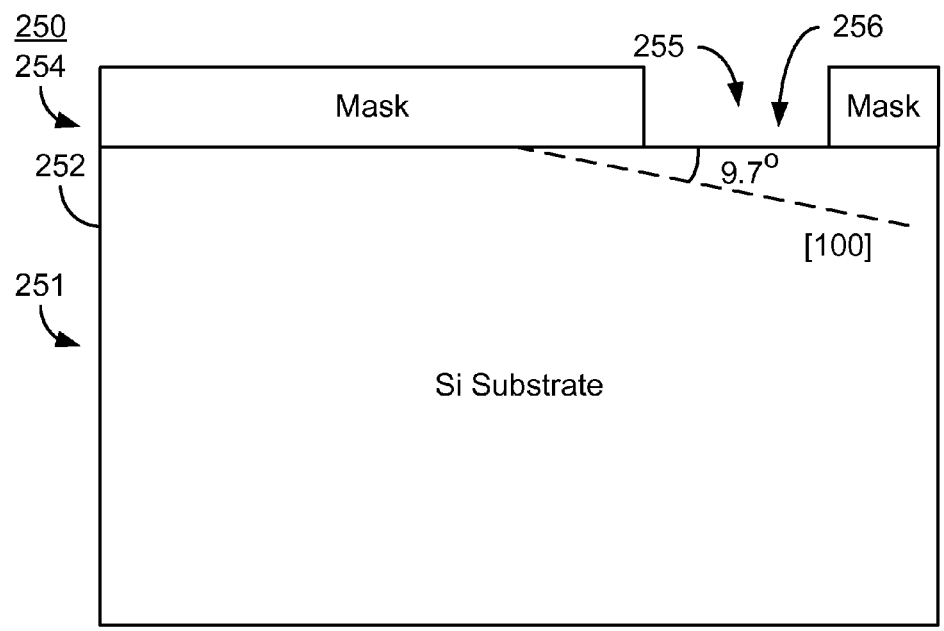
FIGS. 7-14 are diagrams depicting an exemplary embodiment of an EAMR head during fabrication.

A silicon substrate is cut at an angle of 9.7° from a [100] plane, via step 202. Thus, a top surface of the silicon substrate is exposed. FIG. 7 depicts the capping layer 251 for the EAMR head 250 after step 202 is performed. In particular, the silicon substrate 252 for the capping layer 251 having a top surface 256 is shown. The top surface 256 of the substrate 252 is at an angle of 9.7° from a [100] plane. For simplicity, the [100] plane and corresponding angle are only depicted in FIG. 7.

The silicon substrate is etched using a wet etch to form a v-groove trench in the substrate, via step 204. Step 204 includes masking the substrate 252. FIG. 7 depicts the capping layer 251 including one such mask 254. The mask 254 includes an aperture 255 exposing a region of the substrate 252 in which the v-groove trench is to be formed. In some embodiments, the mask 254 may include a dielectric such as $SiO_2$, $SiN_x$, and/or SiC. In other embodiments, the mask 254 may include a metal such as Au and/or NiNb. The mask 254 may be patterned using conventional photolithography and a dry etch such as an RIE and/or ion milling.

Figure 8:
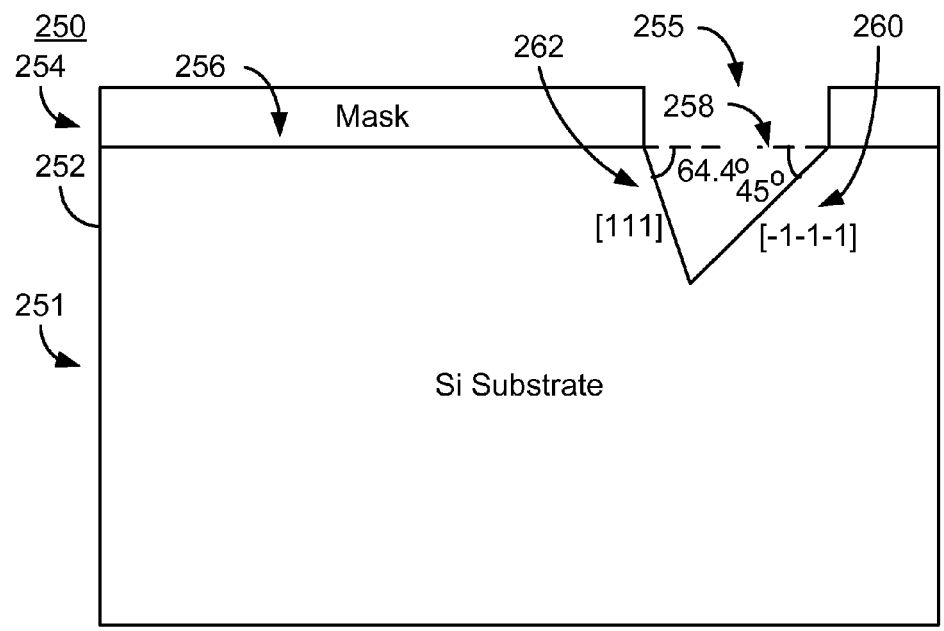

The wet etch used in step 204 may be both anisotropic and self-limiting. The etch may use silicon etchants such as KOH (potassium dihydride) and EDP (Ethylenediamine pyrocatechol). In some embodiments, this etch is self-limiting along a [111] plane set. Stated differently, the etch slows and eventually stops substantially at the [111] planes. FIG. 8 depicts the capping layer 251 of the EAMR head 250 after step 204 is performed. Thus, a v-groove 258 has been formed. Because the etch is self limiting for [111] planes, the v-groove trench 258 has a first surface 260 along a [−1 −1 −1] plane at a first angle of 45° from the top surface 256. For similar reasons, the v-groove trench 255 also includes a second surface 262 along a [111] plane at a second angle from the top surface, via step 204. The second angle is 64.4°. The angles of the surface 260 and 262 are controlled by the orientation of the crystallographic planes which the etch tends not to remove and the location of the top surface. In addition, the length of the first surface 258 shown in FIG. 8 is controlled by the orientation of the planes. Further, the surfaces 260 and 262 are smooth. In some embodiments, the RMS variation in roughness for the surfaces 260 and 262 is not more than five nanometers.

Figure 9:
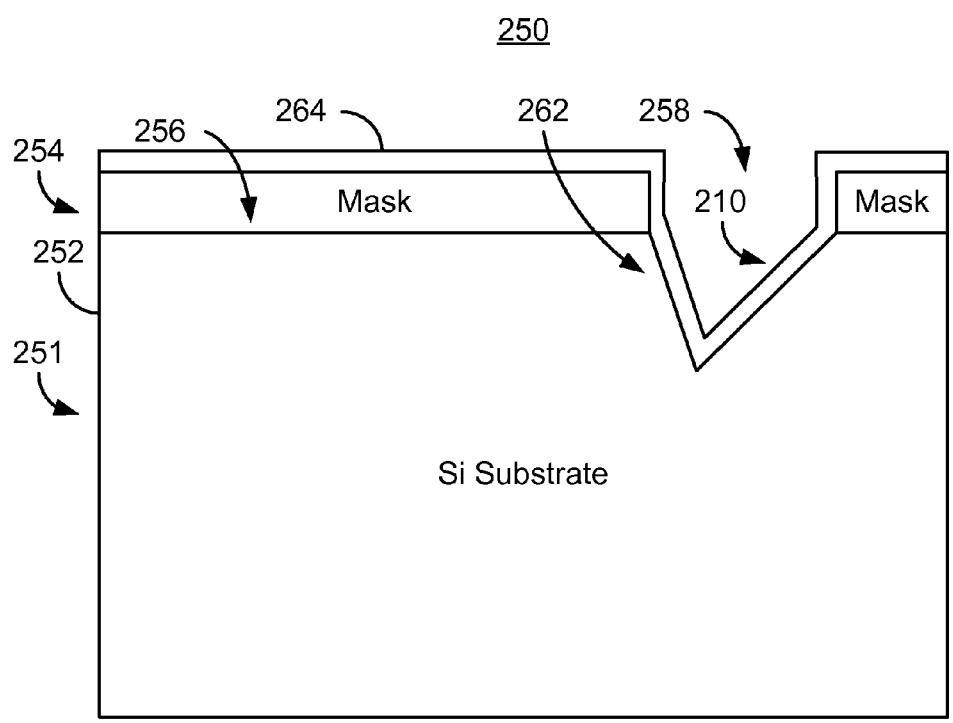

A protective coating layer covering at least the first surface 260 and the second surface 262 is deposited, via step 206. The protective coating layer may be a etch mask. The protective coating layer is used to prevent a portion of the substrate 252 from being etched during formation of the laser cavity, as described below. In some embodiments, the protective coating layer may be a material such as $SiO_2$. However, in other embodiments, another material may be used. FIG. 9 depicts the capping layer 251 after step 206 is performed. Thus, a protective coating layer 264 is shown. In the embodiment depicted, the protective coating layer 264 extends across the substrate 252. However, in another embodiment, the protective coating layer 264 may cover only a portion of the substrate.

Figure 10:
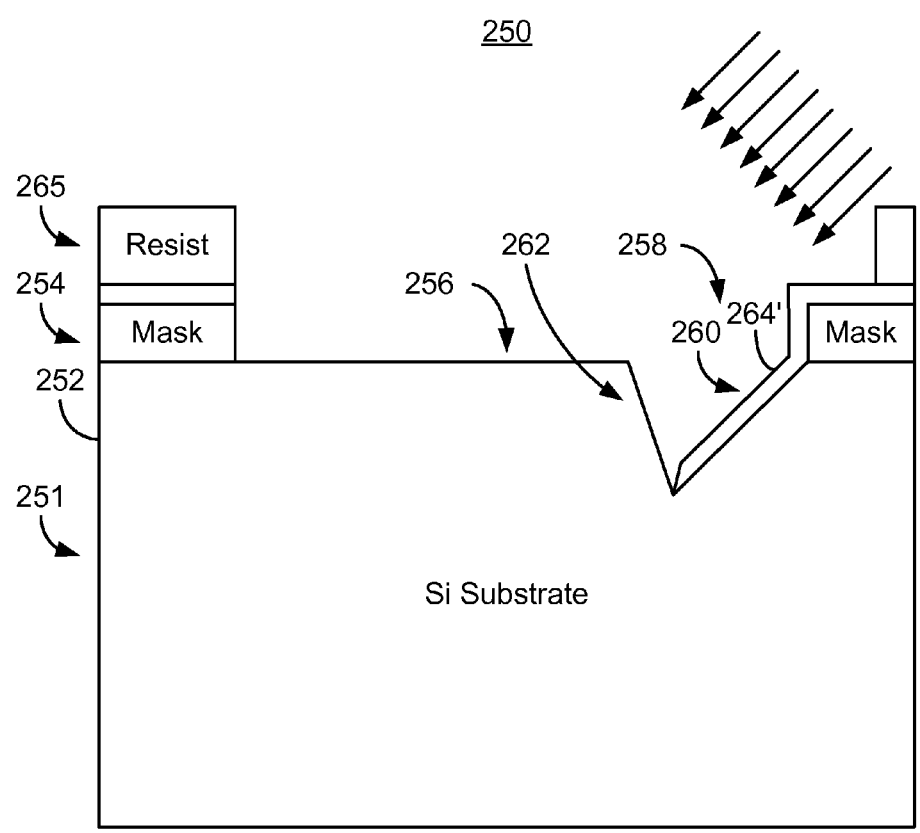

The capping layer 251 is ion milled to remove a portion of the protective coating layer 264, via step 208. Step 208 includes masking a portion of the capping layer 251, for example with a photoresist mask. The capping layer 251 is milled at a milling angle that corresponds to the first surface 260. In some embodiments, the milling angle is such that the beam travels in a direction within ten degrees of the first surface 260. In other embodiments, however, another angle might be used. The ion milling removes the exposed portion of the capping layer except for the capping layer residing on the first surface 260. FIG. 10 depicts the capping layer 251 of the EAMR head 250 during step 208. Thus, a photoresist mask 265 is shown. Except for the protective coating 264' remaining on the first surface 260, the portion of protective coating layer exposed by the mask 265 has been removed. More particularly, the ion milling removes the portion of the protective coating layer on at least the second surface 262.

Figure 11:
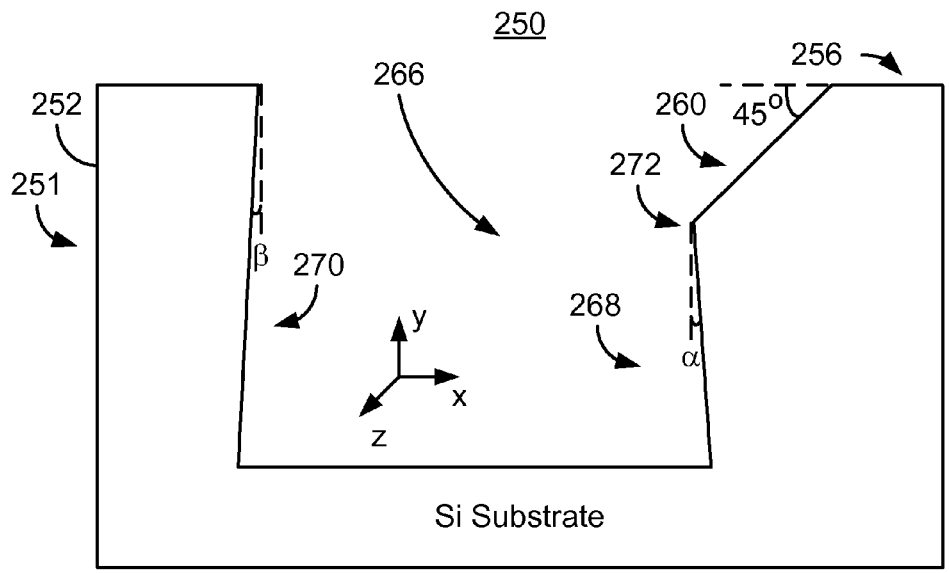

A deep silicon RIE is performed, via step 210. The RIE removes a portion of the silicon substrate 252 including the second surface 262. Thus, a laser cavity is formed within the silicon substrate 252. FIG. 11 depicts the capping layer 251 for the EAMR head 250 after step 210 is performed. Thus, a laser cavity 266 has been formed. The laser cavity 266 is configured to fit at least one laser for the EAMR head 250 therein. The laser cavity 266 also has re-entrant sidewalls 268 and 270. The re-entrant sidewalls 268 and 270 form re-entrant angles α and β, respectively, with normal to the top surface 256. The re-entrant angles may be the same. In other embodiments, the re-entrant angles may be different. In some embodiments, the re-entrant angle α is at least zero degrees and less than or equal to ten degrees. In some such embodiments, the re-entrant angle is at least one degree. The re-entrant sidewall 268 meets the first surface 260 at standoff edge 272. The standoff edge 272 may be used to align the laser in the x direction in FIG. 11.

Figure 12:
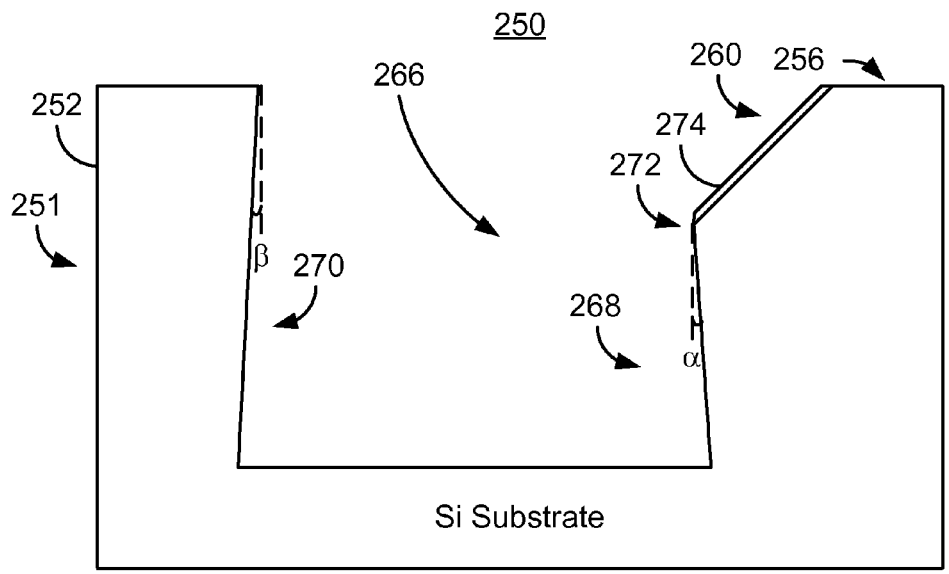

A reflective layer is provided on the first surface to form a mirror, via step 212. Step 212 may be performed after step 210. In such an embodiment, the protective coating 264' is removed, a mask exposing only the first surface 260 is optionally provided, and the reflective layer is deposited. In other embodiments, the reflective layer may be deposited before the protective coating is deposited in step 206. In such embodiments, step 208 would remove both the protective coating 264 and the reflective layer from the second surface 262. FIG. 12 depicts the capping layer 251 for the EAMR head 250 after step 212 is performed. Thus, the reflective layer/mirror 274 has been provided. The laser cavity 266 and the mirror 274 are configured for alignment of the laser to the laser cavity 266 and to the mirror 274 using the standoff edge 272 and the top surface 256. This is accomplished in step 214, described below.

Figure 13:
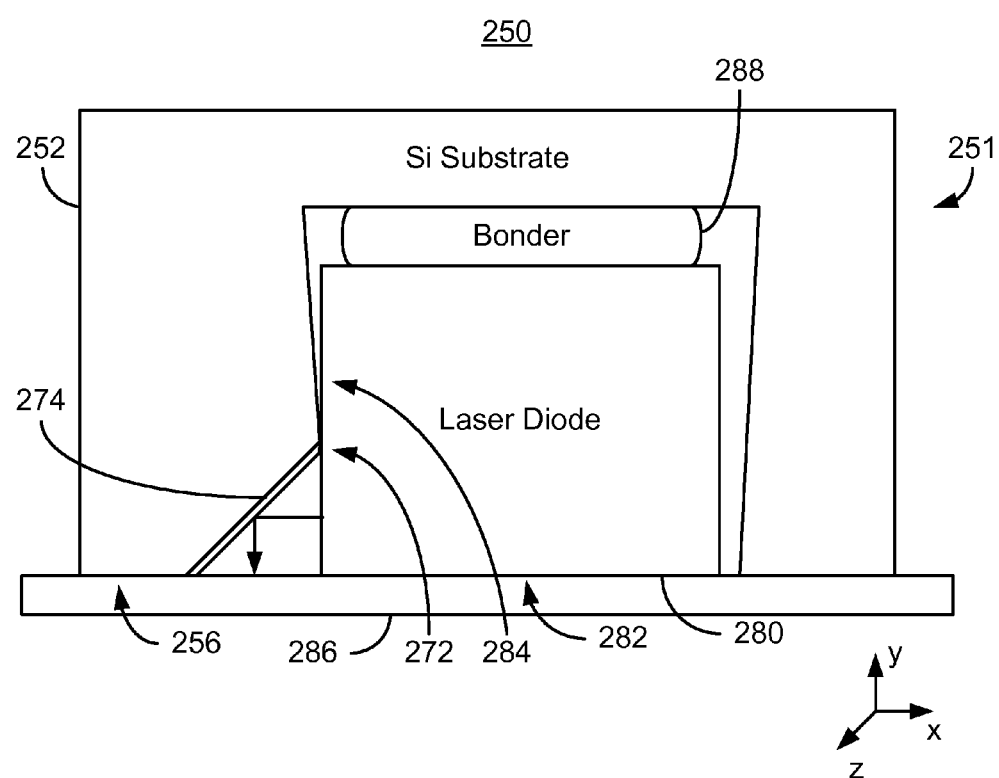

At least one laser is aligned to the capping layer 251 using the top surface 256 and the standoff edge 272, via step 214. In particular, the junction surface of the laser that is to be attached to the slider is aligned with the top surface 256 of the capping layer 215. This may be achieved by placing the laser on a flat, working surface. A bonder, such as epoxy, may be placed on the laser or within the laser cavity 266. The capping layer 251 is placed over the laser and, if necessary, moved such that the standoff edge 272 contacts one face of the laser and the top surface 256 is level with the working surface. In other embodiments, the laser may be placed directly on the slider and the same process carried out. The laser is then bonded to the capping layer 251. For example, FIG. 13 depicts one embodiment of the EAMR head 250 after step 214 is completed. The laser shown is a laser diode 280. The laser diode 280 includes a junction surface 282 and a light emitting surface 284. The junction surface 282 is aligned with the top surface 256 of the capping layer 251. In the embodiment shown, this is achieved by using a bonding surface 286. In one embodiment, the bonding surface 286 may include electrical connections and other features used to couple the laser diode 280 to the slider (not shown in FIG. 13). In such embodiments, the laser diode 280 and capping layer 251 may be bonded to the bonding surface 286. In other embodiments, the bonding surface 286 is used for alignment and bonding of the laser diode 280 and the capping layer 251 only. In still other embodiments, the working surface 286 may be replaced by the slider. As can be seen in FIG. 13, alignment of the junction surface 282 with the top surface 256 aligns the laser diode 280 and the mirror 274 in the y direction. In addition, the light emitting surface 284 of the laser diode 280 contacts the standoff edge 272. Thus, the laser diode 280 and the mirror 274 are also aligned in the x direction due to the standoff edge 272. The laser 280 is also bonded to the capping layer 251 using bonder 288.

Figure 14:
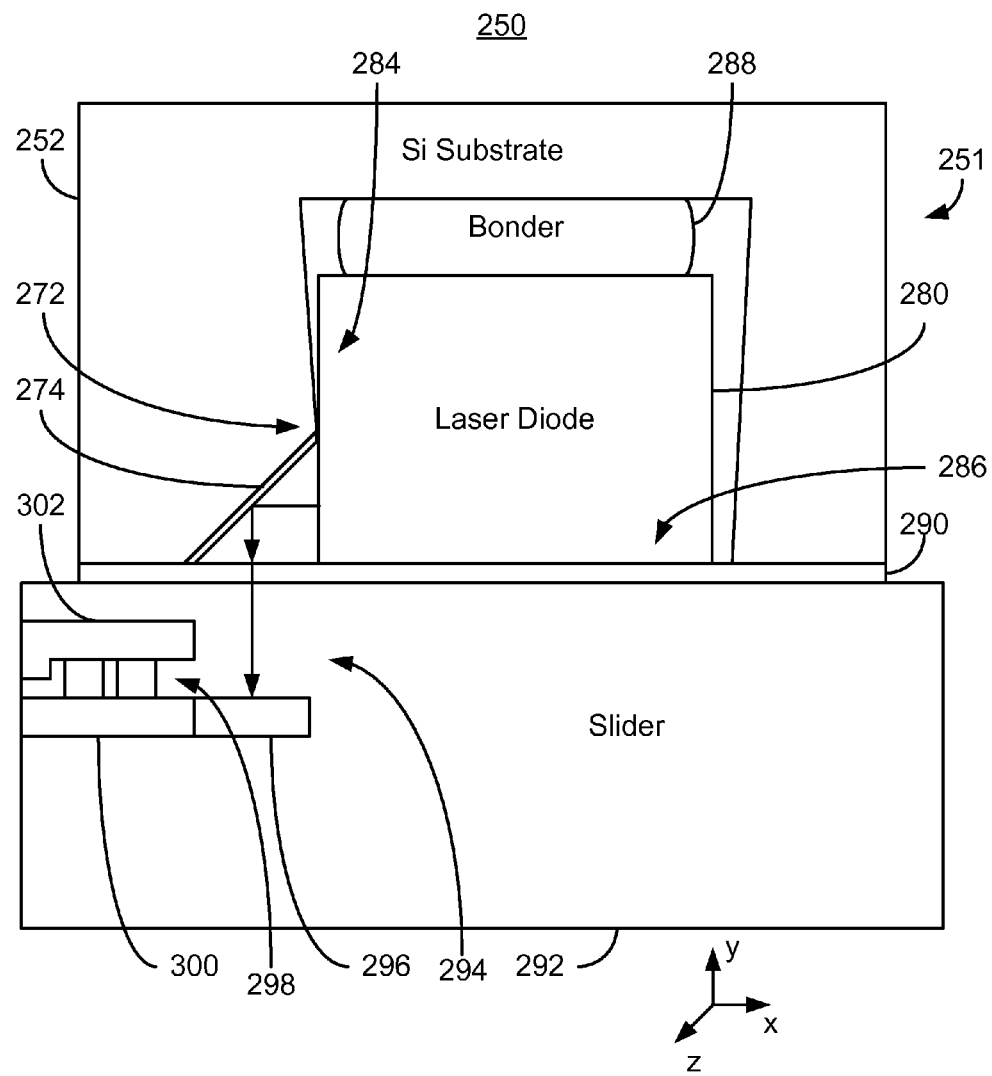

The laser 280 and the capping layer 251 are attached to a slider, via step 216. Step 216 may include aligning the laser 280/capping layer 251 package with the desired portion of the slider and bonding the components. FIG. 14 depicts the EAMR head 250 after step 216 is performed. Thus, a slider 292 is shown. The slider 292 includes a write transducer 294 and may optionally include a read transducer (not separately shown). In the embodiment shown, the write transducer 294 includes a grating 296, waveguide 300, coil(s) 298, and pole 302. Other components may be included in the transducer 294. The laser diode 280 and capping layer 251 are bonded to the slider 292 using bonder 290. In some embodiments, solder pads or other mechanical and electrical attachment may be used.

Using the method 200, EAMR heads, such as the EAMR head 250 may be fabricated. The method 200 and EAMR head 250 share the benefits of the method 100 and capping layer 150. Thus, the laser 280 may be aligned to the mirror 274 using the standoff edge 272, top surface 256, light emitting surface 284, and junction surface 282. Further, the mirror 274 may have the desired smoothness. Consequently, the efficiency of coupling light into the media may be improved. In addition, the laser diode 280 may be encased between the capping layer 251 and the slider 292. Thus, the laser diode 280 may be better protected during fabrication and use. Manufacturability and performance of the EAMR heads may thus be improved.

We claim:

1. A capping layer for use in an energy assisted magnetic recording (EAMR) head having a slider and a laser having a junction surface, the junction surface of the laser configured to be attached to the slider, the capping layer comprising:
 a top surface having a laser cavity therein, the top surface configured for alignment to the junction surface of the laser and attachment to the slider;
 a mirror at a first angle from and adjoining the top surface, the first angle corresponding to a particular crystallographic plane and a particular angle;
 the laser cavity configured to fit a laser therein and meeting the mirror at a standoff edge opposite from the top surface, the cavity and mirror being configured for alignment of the laser to the laser cavity and to the mirror using the top surface and the standoff edge.

2. An energy assisted magnetic recording (EAMR) head comprising:
 a slider including a leading edge and a trailing edge and at least one EAMR transducer residing on the slider;
 at least one laser for providing light to the EAMR transducer;
 a capping layer having a top surface, a mirror and a laser cavity therein, the top surface configured for alignment to the junction surface of the laser and attachment to the slider, the mirror at a first angle from and adjoining the top surface, the first angle corresponding to a particular crystallographic plane and a particular angle, the laser cavity configured to fit the laser therein and meeting the mirror at a standoff edge opposite from the top surface.

* * * * *